United States Patent
Shin

(10) Patent No.: US 8,199,607 B2
(45) Date of Patent: Jun. 12, 2012

(54) DUTY CYCLE CORRECTOR PREVENTING EXCESSIVE DUTY CYCLE CORRECTION IN LOW-FREQUENCY DOMAIN

(75) Inventor: Won-hwa Shin, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 303 days.

(21) Appl. No.: 12/706,885

(22) Filed: Feb. 17, 2010

(65) Prior Publication Data

US 2010/0226196 A1 Sep. 9, 2010

(30) Foreign Application Priority Data

Mar. 4, 2009 (KR) .................. 10-2009-0018459

(51) Int. Cl.
*G11C 8/00* (2006.01)
*G11C 8/18* (2006.01)
(52) U.S. Cl. ................................. 365/233.1; 365/194
(58) Field of Classification Search ............... 365/233.1, 365/194; 327/175
See application file for complete search history.

(56) References Cited

U.S. PATENT DOCUMENTS

| 8,049,545 | B2 * | 11/2011 | Kim et al. ................. 327/158 |
| 2002/0024366 | A1 * | 2/2002 | Ooishi et al. ................ 327/156 |
| 2005/0270890 | A1 * | 12/2005 | Kim ......................... 365/233 |

FOREIGN PATENT DOCUMENTS

| JP | 2006217223 A | 8/2006 |
| KR | 1020040021478 A | 3/2004 |
| KR | 1020050102763 A | 10/2005 |

* cited by examiner

*Primary Examiner* — Anh Phung
(74) *Attorney, Agent, or Firm* — Volentine & Whitt, PLLC

(57) ABSTRACT

Provided is a duty cycle corrector including a low frequency detector detecting whether an input clock signal frequency is less than or greater than a predetermined frequency. If less than, a common mode control circuit controlling a common mode of a duty cycle correction amplifier amplifying the input clock signal is disabled. The duty cycle corrector may include a column address strobe (CAS) latency determination unit that determines whether a CAS latency is greater than or less than a predetermined value instead of the low frequency detector.

12 Claims, 10 Drawing Sheets

DUTY CYCLE CORRECTOR PREVENTING EXCESSIVE DUTY CYCLE CORRECTION IN LOW-FREQUENCY DOMAIN

CROSS-REFERENCE TO RELATED APPLICATION

This application claims the benefit of Korean Patent Application No. 10-2009-0018459 filed on Mar. 4, 2009, the subject matter of which is hereby incorporated by reference.

BACKGROUND

The inventive concept relates to semiconductor integrated circuits (ICs), and more particularly, to a duty cycle corrector incorporated within an IC capable of correcting a signal duty cycle.

A delay locked loop (DLL) circuit is commonly included in certain semiconductor memory devices, such as the synchronous dynamic random access memory (SDRAM), which operate synchronously with a reference clock signal. The DLL circuit is capable of a very high degree of integration and may therefore be included within contemporary synchronous memory devices. In general operation, the DLL circuit receives an external clock signal and generates an internal clock signal by delaying the external clock signal for a predetermined delay period. The internal clock signal may then be used as a clock signal by various circuits within the memory device.

The DLL circuit may be variously designed and certain designs include a duty cycle corrector configured to correct the duty cycle of a signal. Duty cycle correctors maintain the duty cycle of an output signal at a fixed ratio of (e.g.,) 5:5.

Without a duty cycle corrector, the DLL circuit may generate the internal clock signal at a duty cycle other than the prescribed ratio. If this happens, an associated transfer window (i.e., a defined period of time during which data/address/control signals are transferred) may become impaired and create the risk of errant signal transfers. For example, input/output data may not be accurately latched or transferred to/from the memory device. Thus, duty cycle correction is performed in order to adjust the duty cycle of a clock signal, such that it remains at a defined ratio (e.g., 5:5). Thus, the operating range of and output characteristics of the duty cycle corrector are influenced by a difference between the duty cycle of a clock signal that is initially applied to the duty cycle corrector (e.g. an output signal received from the DLL circuit) and a target value.

Of additional note, excessive duty cycle correction may deteriorate the output signal characteristics of the duty cycle corrector. Excessive duty cycle correction is likely to occur when duty cycle correction is performed within a low frequency domain.

In general, the duty cycle corrector includes a duty cycle correction amplifier configured to amplify an input clock signal. The duty cycle corrector adjusts the duty cycle of the input clock signal by changing the common mode of the duty cycle correction amplifier using a duty control signal. Accordingly, the range of the common mode is determined by the duty cycle of an initially applied input clock signal.

Figure (FIG.) 1 is a timing diagram illustrating a method of correcting the duty cycle of a high frequency input clock signal and corresponding variation in the common mode. FIG. 2 is a timing diagram illustrating a conventional method of correcting the duty cycle of a low frequency input clock signal and a corresponding variation in the common mode.

As illustrated in FIGS. 1 and 2, duty cycle correction is performed by varying the common mode of an input clock signal ICLK and the common mode of a complementary input clock signal ICLKB in opposite directions. In this case, when a variation $\Delta$ in the common mode increases excessively, the output clock signal OCLK may become distorted.

In particular, when the input clock signal ICLK is a relatively low frequency signal, the extent to which the duty cycle of the input clock signal ICLK needs to be adjusted is greater than when the input clock signal ICLK is a high frequency signal. Thus, as illustrated in FIG. 2, if duty cycle correction is continuously performed on a low frequency the input clock signal ICLK (i.e., a clock signal susceptible to excessive duty cycle correction), then the variation $\Delta$ in the common mode increases greatly and causes distortion in the output clock signal OCLK. In extreme instances, the output clock OCLK distortion may result in the loss of output clock signal OCLK pulses.

SUMMARY

The inventive concept provides a duty cycle corrector capable of preventing excessive duty cycle correction when an input clock signal is a low frequency signal.

According to an aspect of the inventive concept, there is provided a duty cycle corrector including a duty cycle correction amplifier that amplifies an input clock signal and a complementary input clock signal, a low frequency detector that detects whether frequency of the input clock signal is less than a predetermined frequency, a control circuit that receives a duty control signal and a complementary duty control signal, outputs the duty control signal and the complementary duty control signal when the low frequency detector detects that the frequency of the input clock signal is greater than the predetermined frequency, and blocks the duty control signal and the complementary duty control signal when the low frequency detector detects that the frequency of the input clock signal is less than the predetermined frequency; and a common mode control circuit that adjusts duty cycles of the input clock signal and the complementary input clock signal by changing a common mode of the duty cycle correction amplifier, in response to the duty control signal and the complementary duty control signal received from the control circuit.

If the low frequency detector detects that the frequency of the input clock signal is greater than the predetermined frequency, the common mode control circuit adjusts the duty cycles of the input clock signal and the complementary input clock signal by changing the common mode of the duty cycle correction amplifier, in response to the duty control signal and the complementary duty control signal received from the control signal. If the low frequency detector detects that the frequency of the input clock signal is less than the predetermined frequency, the common mode control circuit is disabled.

The common mode control circuit may include a main common mode control circuit that adjusts the duty cycles of the input clock signal and the complementary input clock signal by changing the common mode of the duty cycle correction amplifier, the duty control signal and the complementary duty control signal being directly supplied to the main common mode control circuit; and an auxiliary common mode control circuit that additionally changes the common mode of the duty cycle correction amplifier, in response to the duty control signal and the complementary duty control signal received from the control circuit.

If the low frequency detector detects that the frequency of the input clock signal is greater than the predetermined frequency, the auxiliary common mode control circuit additionally changes the common mode of the duty cycle correction amplifier, in response to the duty control signal and the complementary duty control signal received from the control circuit. If the low frequency detector detects that the frequency of the input clock signal is less than the predetermined frequency, the auxiliary common mode control circuit is disabled.

According to another aspect of the inventive concept, there is provided a duty cycle corrector for use in a semiconductor memory device, the duty cycle corrector including a duty cycle correction amplifier that amplifies an input clock signal and a complementary input clock signal, a column address strobe (CAS) latency determination unit that determines whether a CAS latency of the semiconductor memory device is greater than or less than a predetermined value; a control circuit that receives a duty control signal and a complementary duty control signal, outputs the duty control signal and the complementary duty control signal when the CAS latency determination unit determines that the CAS latency is greater than the predetermined value, and blocks the duty control signal and the complementary duty control signal when the CAS latency determination unit determines that the CAS latency is less than the predetermined value; and a common mode control circuit that adjusts duty cycles of the input clock signal and the complementary input clock signal by changing a common mode of the duty cycle correction amplifier, in response to the duty control signal and the complementary duty control signal received from the control circuit.

If the CAS latency determination unit determines that the CAS latency is greater than the predetermined value, the common mode control circuit adjusts the duty cycles of the input clock signal and the complementary input clock signal by changing the common mode of the duty cycle correction amplifier, in response to the duty control signal and the complementary duty control signal received from the control signal. If the CAS latency determination unit determines that the CAS latency is less than the predetermined value, the common mode control circuit is disabled.

The common mode control circuit may include a main common mode control circuit that adjusts the duty cycles of the input clock signal and the complementary input clock signal by changing the common mode of the duty cycle correction amplifier, the duty control signal and the complementary duty control signal being directly supplied to the main common mode control circuit; and an auxiliary common mode control circuit that additionally changes the common mode of the duty cycle correction amplifier, in response to the duty control signal and the complementary duty control signal received from the control circuit.

If the CAS latency determination unit determines that the CAS latency is greater than the predetermined value, the auxiliary common mode control circuit additionally changes the common mode of the duty cycle correction amplifier, in response to the duty control signal and the complementary duty control signal received from the control circuit.

If the CAS latency determination unit determines that the CAS latency is less than the predetermined value, the auxiliary common mode control circuit is disabled.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
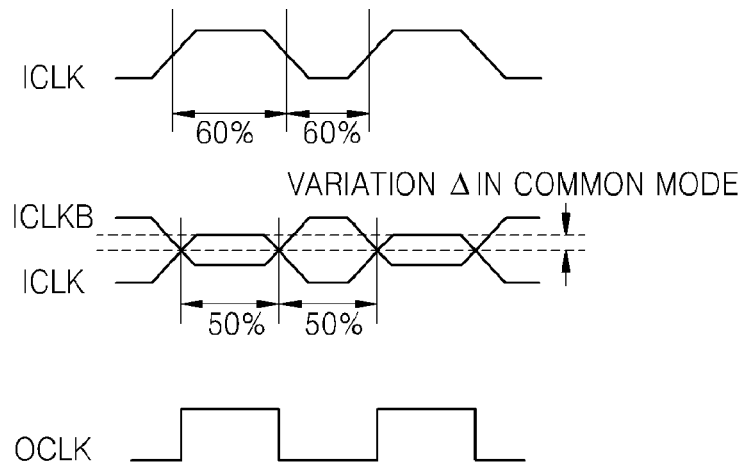
FIG. 1 is a timing diagram illustrating a conventional approach to correcting the duty cycle of a high frequency input clock signal and variation in common mode.

Hereinafter, embodiments of the inventive concept will be described in some additional detail with reference to the accompanying drawings. Through out the written description and drawings, like reference numerals denote like or similar elements.

Figure 3:
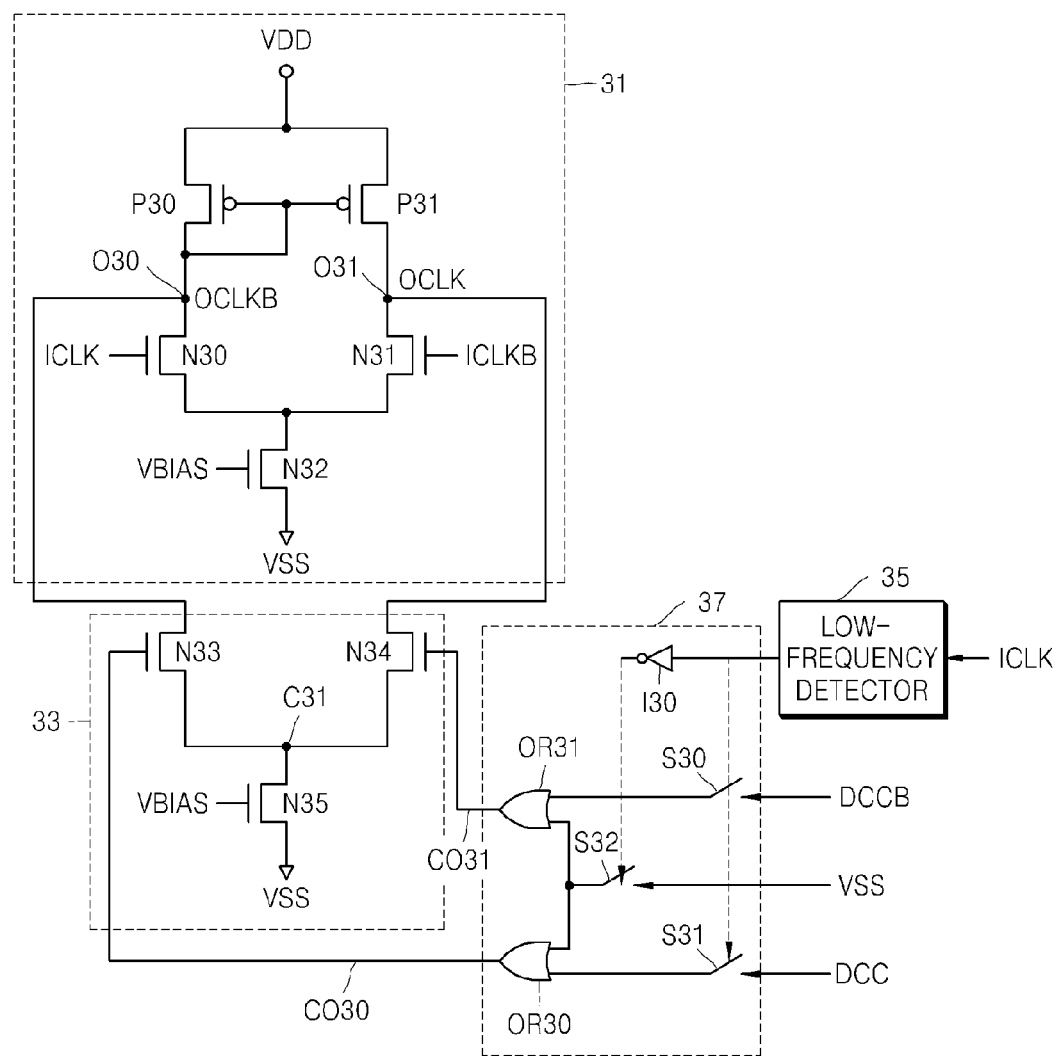
FIG. 3 is a circuit diagram of a duty cycle corrector according to an embodiment of the inventive concept.

FIG. 3 is a circuit diagram of a duty cycle corrector according to an embodiment of the inventive concept. Referring to FIG. 3, the duty cycle corrector comprises a duty cycle correction amplifier 31 and a common mode control circuit 33. The duty cycle corrector also comprises a low frequency detector 35 and a control circuit 37 which operatively prevent excessive duty cycle correction when an input clock signal ICLK is a low frequency signal.

The duty cycle correction amplifier 31 amplifies the input clock signal ICLK and a complementary input clock signal ICLKB, and outputs an output clock signal OCLK and a complementary output clock signal OCLKB.

The low frequency detector 35 detects whether the frequency of the input clock signal ICLK is less than a predetermined frequency. The control circuit 37 receives a duty control signal DCC and a complementary duty control signal DCCB, and respectively outputs the duty control signal DCC and the complementary duty control signal DCCB as first and second output signals CO30 and CO31 when the frequency detector 35 detects that the frequency of the input clock signal ICLK is greater than the predetermined frequency. If the frequency detector 35 detects that the frequency of the input clock signal ICLK is less than the predetermined frequency, the control circuit 37 blocks the duty control signal DCC and the complementary duty control signal DCCB, and outputs a ground voltage VSS as the first and second output signals CO30 and CO31.

The common mode control circuit 33 adjusts the duty cycles of the input clock signal ICLK and the complementary input clock signal ICLKB by changing a common mode of the duty cycle correction amplifier 31, in response to the first and second output signals CO30 and CO31 received from the control circuit 37.

In detail, when the frequency detector 35 detects that the frequency of the input clock signal ICLK is greater than the predetermined frequency, the common mode control circuit 33 adjusts the duty cycles of the input clock signal ICLK and the complementary input clock signal ICLKB by changing the common mode of the duty cycle correction amplifier 31, in response to the duty control signal DCC and the complementary duty control signal DCCB received as the first and second output signals CO30 and CO31 from the control circuit 37. Then, the output clock signal OCLK and the complementary output clock signal OCLKB, the duty cycles of which are corrected are output from the duty cycle correction amplifier 31.

When the frequency detector 35 detects that the frequency of the input clock signal ICLK is less than the predetermined frequency, the common mode control circuit 33 is disabled in response to the ground voltage VSS received as the first and second output signals CO30 and CO31 from the control circuit 37. Thus, when the frequency of the input clock signal ICLK is less than the predetermined frequency, duty cycle operating current is blocked, thereby preventing duty cycle correction from being performed.

Figure 2:
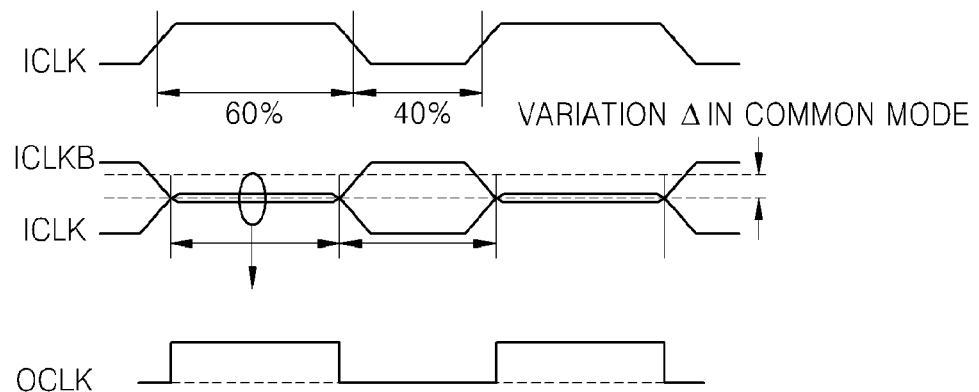
FIG. 2 is a timing diagram illustrating a conventional approach to correcting the duty cycle of a low frequency input clock signal and variation in common mode

That is, if the frequency of the input clock signal ICLK is relatively low, the common mode control circuit 33 may be effectively disabled to prevent variation Δ in the common mode from excessively increasing in great contrast to the conventional outcome described in relation to FIG. 2 to thereby prevent excessive duty cycle correction. Accordingly, it is possible to prevent the output clock signal OCLK from becoming distorted and dropping output clock signal OCLK pulses.

In the illustrated embodiment of FIG. 3, the duty cycle correction amplifier 31 is a general differential amplification circuit, and includes PMOS load transistors P30 and P31, NMOS input transistors N30 and N31, and an NMOS bias current control transistor N32. The output clock signal OCLK is output from a node at which the PMOS load transistor P31 and the NMOS input transistor N31 are connected to each other. The complementary output clock signal OCLKB is output from a node at which the PMOS load transistor P30 and the NMOS input transistor N30 are connected to each other.

The common mode control circuit 33 includes a first NMOS control transistor N33, a second NMOS control transistor N34, and an NMOS bias transistor N35. The first NMOS control transistor N33 has one end connected to an inverted output node O30 of the duty cycle correction amplifier 31, the other end connected to a common node C31, and a gate to which the first output signal CO30 is supplied from the control circuit 37. The second NMOS control transistor N34 has one end connected to an output node O31 of the duty cycle correction amplifier 31, the other end connected to the common node C31, and a gate to which the second output signal CO31 is supplied from the control circuit 37. The NMOS bias transistor N35 has one end connected to the common node C31, the other end connected to a source of ground voltage VSS, and a gate to which bias voltage VBIAS is applied.

In the illustrated embodiment of FIG. 3, the control circuit 37 comprises an inverter I30, a first switch S30, a second switch S31, a third switch S32, a first OR gate OR30, and a second OR gate OR31. The inverter I30 inverts an output signal of the low frequency detector 35 and outputs the inverted signal. The first switch S30 and the second switch S31 are turned ON/OFF in response to the output signal of the low frequency detector 35. The third switch S32 is turned ON/OFF in response to an output signal of the inverter I30.

If the frequency of the input clock signal ICLK is greater than the predetermined frequency, the output signal of the low frequency detector 35 is in a first logic state (e.g., a logical "high"), thereby turning ON the first switch S30 and the second switch S31 and turning OFF the third switch S32. Thus, the duty control signal DCC is output as an output signal of the first OR gate OR30, that is, the first output signal CO30 output from the control circuit 37, and the complementary duty control signal DCCB is output as an output signal of the second OR gate OR31, i.e., the second output signal CO31 output from the control circuit 37.

If the frequency of the input clock signal ICLK is less than the predetermined frequency, the output signal of the low frequency detector 35 is in a second logic state (e.g., a logical "low"), thereby turning OFF the first switch S30 and the second switch S31 and turning ON the third switch S32. Thus, the ground voltage VSS is output as the output signal of the first OR gate OR30, i.e., the first output signal CO30 output from the control circuit 37, and the ground voltage VSS is output as the output signal of the second OR gate OR31, i.e., the second output signal CO31 output from the control circuit 37.

Figure 4:
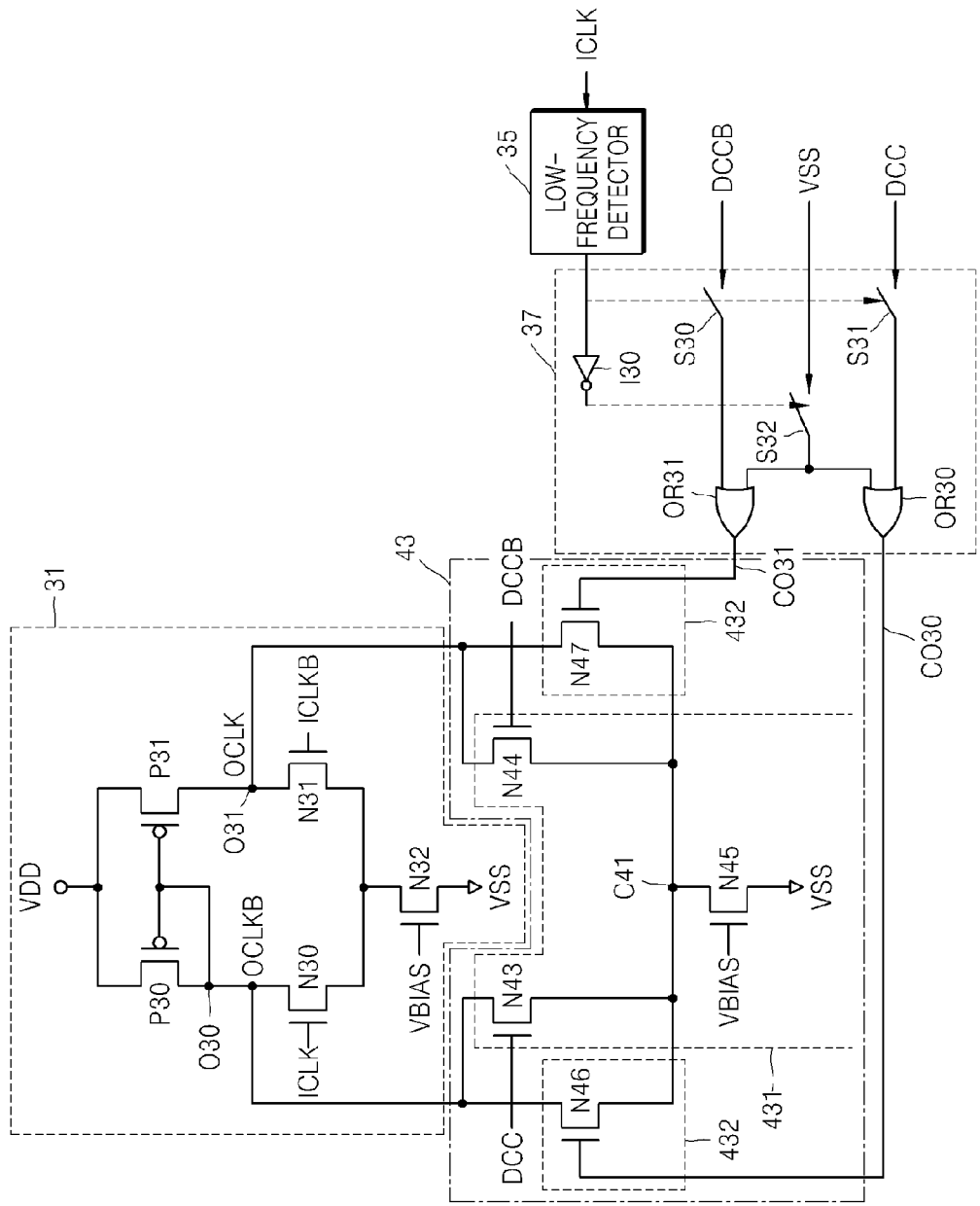
FIG. 4 is a circuit diagram of a duty cycle corrector according to another embodiment of the inventive concept.

FIG. 4 is a circuit diagram of a duty cycle corrector according to another embodiment of the inventive concept. Referring to FIG. 4, the duty cycle corrector comprises a duty cycle correction amplifier 31, a common mode control circuit 43, a low frequency detector 35, and a control circuit 37.

The duty cycle correction amplifier 31, the low frequency detector 35, and the control circuit 37 illustrated in FIG. 4 are substantially the same as the duty cycle correction amplifier 31, the low frequency detector 35, and the control circuit 37 described in relation to FIG. 3, and thus, a detailed description will not be repeated.

Referring to FIG. 4, the implementation of the common mode control circuit 43 is different from the common mode control circuit 33 of FIG. 3. The common mode control circuit 43 includes a main common mode control circuit 431 and an auxiliary common mode control circuit 432. The main common mode control circuit 431 adjusts the duty cycles of an input clock signal ICLK and a complementary input clock signal ICLKB by changing a common mode of the duty cycle correction amplifier 31, in response to a duty control signal DCC and a complementary duty control signal DCCB that are directly supplied to the common mode control circuit 43. The auxiliary common mode control circuit 432 additionally changes the common mode of the duty cycle correction amplifier 31, in response to output signals CO30 and CO31 received from control circuit 37

As described above, when the low frequency detector 35 detects that the frequency of the input clock signal ICLK is greater than a predetermined frequency, a duty control signal DCC and a complementary duty control signal DCCB are output as the first and second output signals CO30 and CO31 from the control circuit 37. Thus, in this case, the auxiliary common mode control circuit 432 additionally changes the common mode of the duty cycle correction amplifier 31, in response to the duty control signal DCC and the complementary duty control signal DCCB that are respectively output as the first and second output signals CO30 and CO31 from the control circuit 37.

However, when the low frequency detector 35 detects that the frequency of the input clock signal ICLK is less than the predetermined frequency, a ground voltage VSS is output as the first and second output signals CO30 and CO31 from the control circuit 37. Thus, in this case, the auxiliary common mode control circuit 432 is disabled.

In other words, when the frequency of the input clock signal ICLK is greater than the predetermined frequency, both the main common mode control circuit 431 and the auxiliary common mode control circuit 432 change the common mode of the duty cycle correction amplifier 31. However, when the frequency of the input clock signal ICLK is less than the predetermined frequency, the auxiliary common mode control circuit 432 is disabled, and thus, only the main common mode control circuit 431 changes the common mode of the duty cycle correction amplifier 31.

That is, when the frequency of the input clock signal ICLK is relatively low, the auxiliary common mode control circuit 432 is disabled to prevent variation Δ in the common mode from excessively increasing in contrast to the outcome described in relation to FIG. 2 to thereby prevent excessive duty cycle correction. Accordingly, it is possible to prevent the output clock signal OCLK from becoming distorted and dropping output clock signal OCLK pulses.

The main common mode control circuit 431 includes an NMOS control transistor N43, an NMOS control transistor N44, and an NMOS bias transistor N45. The NMOS control transistor N43 has one end connected to an inverted output node O30 of the duty cycle correction amplifier 31, the other end connected to a common node C41, and a gate to which the duty control signal DCC is directly applied. The NMOS control transistor N44 has one end connected to an output node O31 of the duty cycle correction amplifier 31, the other end connected to the common node C41, and a gate to which the complementary duty control signal DCCB is directly applied. The NMOS bias transistor N45 has one end connected to the common node C41, the other end connected to a source of ground voltage VSS, and a gate to which a bias voltage VBIAS is applied.

The auxiliary common mode control circuit 432 includes an NMOS control transistor N46 and an NMOS control transistor N47. The NMOS control transistor N46 includes one end connected to the inverted output node O30 of the duty cycle correction amplifier 31, the other end connected to the common node C41, and a gate to which the first output signal CO30 is supplied from the control circuit 37. The NMOS control transistor N47 includes one end connected to the output node O31 of the duty cycle correction amplifier 31, the other end connected to the common node C41, and a gate to which the second output signal CO31 is supplied from the control circuit 37.

Figure 5:
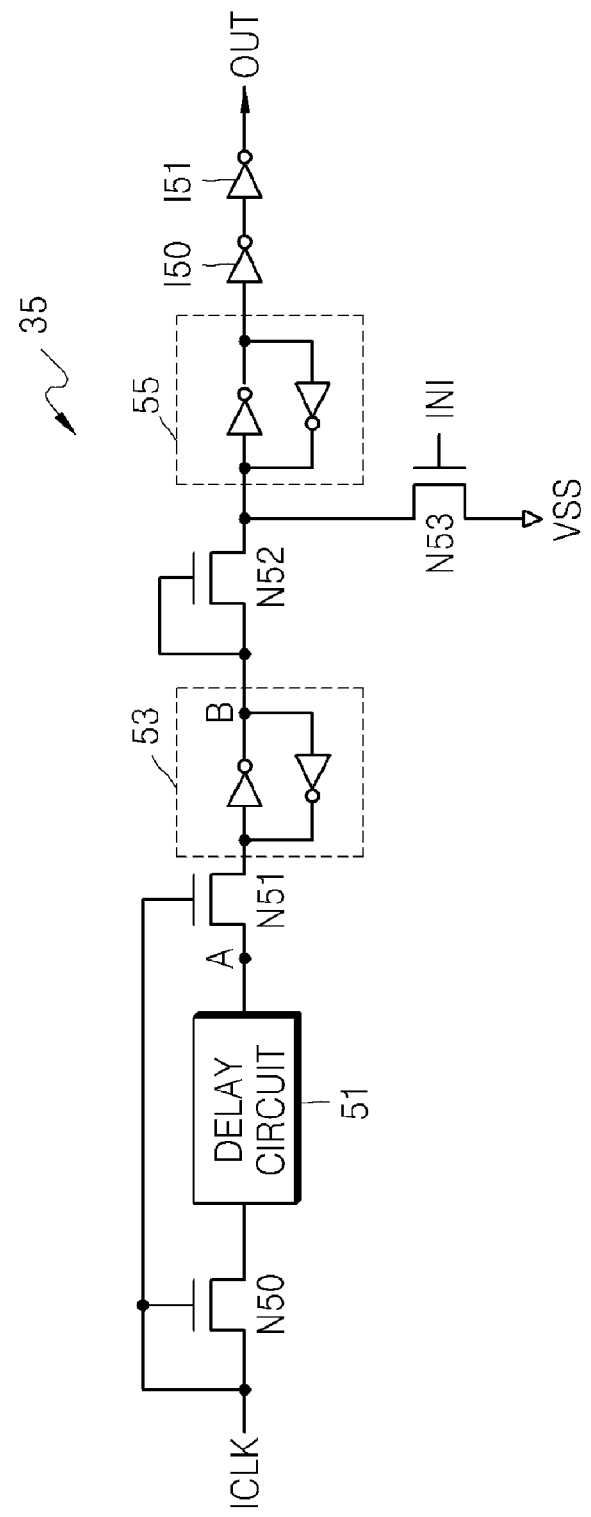
FIG. 5 is a circuit diagram further illustrating the low frequency detector of FIGS. 3 and 4 according to an embodiment of the inventive concept.
Figure 6:
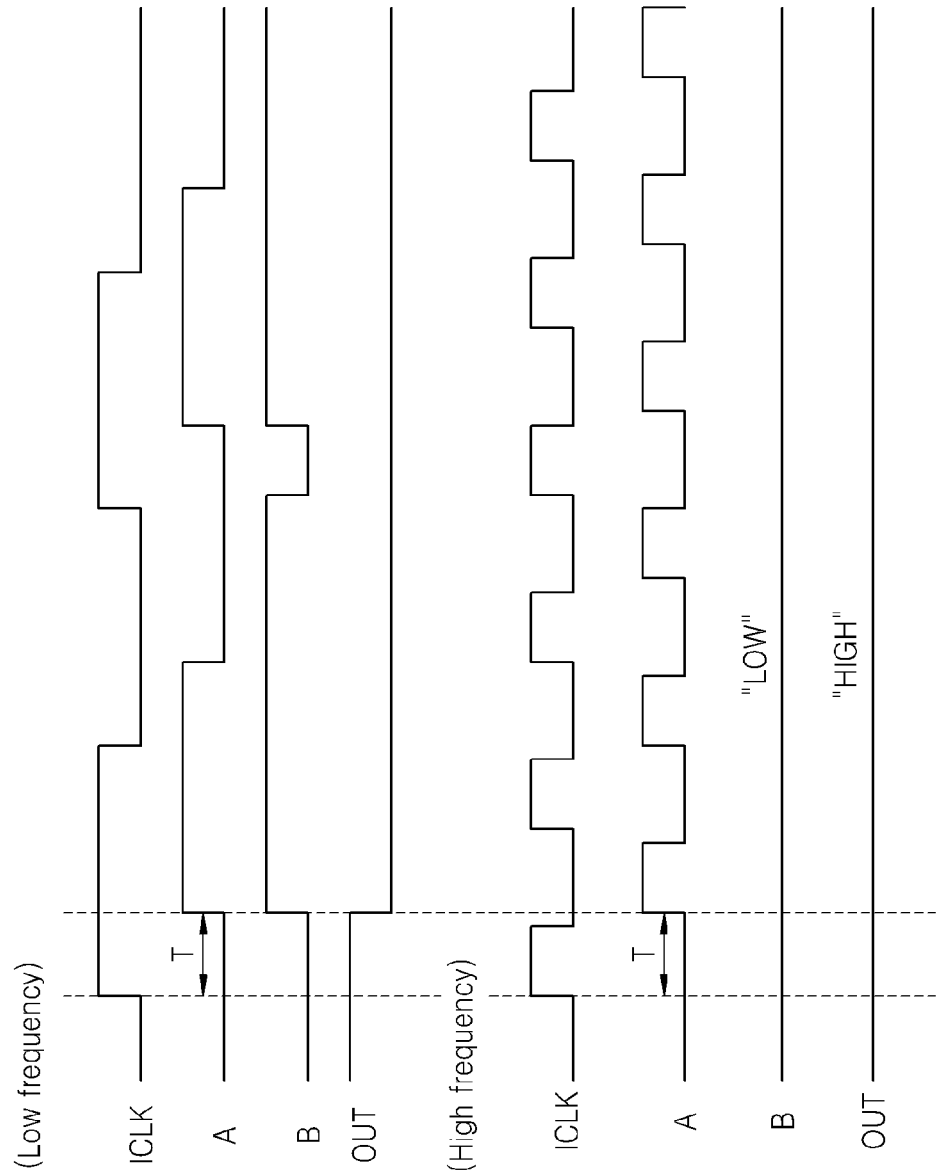
FIG. 6 is a signal waveform diagram related to the operation of the low frequency detector illustrated in FIG. 5 according to an embodiment of the inventive concept.

FIG. 5 is a circuit diagram further illustrating the low frequency detector 35 of FIG. 3 or 4 according to one possible embodiment of the inventive concept. FIG. 6 is a signal waveform diagram further illustrating the operation of the low frequency detector 35 of FIG. 5 according to an embodiment of the inventive concept.

Referring to FIG. 5, the low frequency detector 35 comprises NMOS transfer transistors N50, N51, and N52, a delay circuit 51, latches 53 and 55, inverters I50 and I51, and an NMOS pull-down transistor N53.

In FIG. 6, the time period 'T' denotes a delay time applied by the delay circuit 51, signal 'A' denotes an output signal of the delay circuit 51, signal 'B' denotes an output signal of the latch 53, and signal 'OUT' denotes a final output signal of the low frequency detector 35.

When the frequency of an input clock signal ICLK is relatively low (e.g., when half a cycle of the input clock signal ICLK is greater than the delay time T in the delay circuit 51) the final output signal OUT of the low frequency detector 35 goes low. When the frequency of the input clock signal ICLK is relatively high (e.g., when half a cycle of the input clock signal ICLK is less than the delay time T in the delay circuit 51) the final output signal OUT of the low frequency detector 35 goes high.

Figure 7:
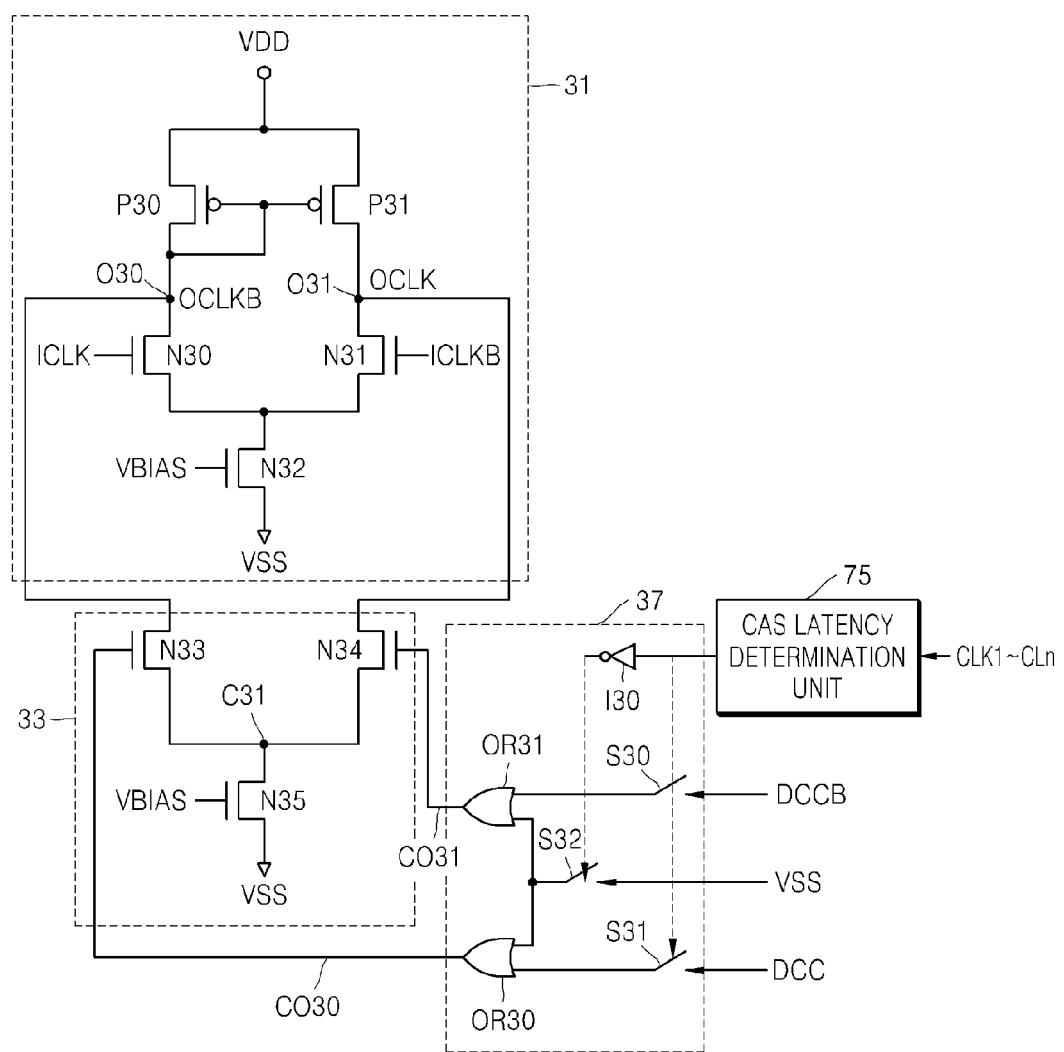
FIG. 7 is a circuit diagram of a duty cycle corrector according to another embodiment of the inventive concept.

FIG. 7 is a circuit diagram of a duty cycle corrector according to another embodiment of the inventive concept. Application of the duty cycle corrector of FIG. 7 is illustrated in relation to a synchronous semiconductor memory device, (e.g., synchronous DRAM) providing a defined column address strobe (CAS) latency.

Referring to FIG. 7, the duty cycle corrector comprises a duty cycle correction amplifier 31, a common mode control circuit 33, a CAS latency determination unit 75, and a control circuit 37.

The duty cycle correction amplifier 31, the common mode control circuit 33, and the control circuit 37 illustrated in FIG. 7 are substantially the same as the duty cycle correction amplifier 31, the common mode control circuit 33, and the control circuit 37 of FIG. 3, and thus a detailed description will not be repeated here.

However, the CAS latency determination unit 75 determines whether a CAS latency CL1-CLn of the synchronous semiconductor memory device is greater than or less than a predetermined value. The CAS latency CL1-CLn is a value defined with respect to the incorporating synchronous semiconductor memory device. That the CAS latency CL1-CLn is large means that the frequency of an input clock signal ICLK supplied outside the semiconductor memory device is high. That the CAS latency CL1-CLn is small means that the frequency of the input clock signal ICLK supplied outside the semiconductor memory device is low.

The control circuit 37 receives a duty control signal DCC and a complementary duty control signal DCCB, and respectively outputs the duty control signal DCC and the complementary duty control signal DCCB as first and second output signals CO30 and CO31 when the CAS latency determination unit 75 determines that the CAS latency CL1-CLn is greater than the predetermined value. When the CAS latency determination unit 75 determines that the CAS latency CL1-CLn is less than the predetermined value, the control circuit 37 blocks the duty control signal DCC and the complementary duty control signal DCCB, and outputs a ground voltage VSS as the first and second output signals CO30 and CO31.

The common mode control circuit 33 adjusts the duty cycles of an input clock signal ICLK and a complementary input clock signal ICLKB by changing a common mode of the duty cycle correction amplifier 31, in response to the first and second output signals CO30 and CO31 received from the control circuit 37.

In detail, if the CAS latency determination unit 75 determines that the CAS latency CL1-CLn is greater than the predetermined value, the common mode control circuit 33 adjusts the duty cycles of the input clock signal ICLK and the complementary input clock signal ICLKB by changing the common mode of the duty cycle correction amplifier 31, in response to the duty control signal DCC and complementary duty control signal DCCB received as the first and second output signals CO30 and CO31 from the from control circuit 37. Then, an output clock signal OCLK and a complementary output clock signal OCLKB, the duty cycles are corrected are output from the duty cycle correction amplifier 31.

If the CAS latency determination unit 75 determines that the CAS latency CL1-CLn is less than the predetermined value, the common mode control circuit 33 is disabled, in response to the ground voltage VSS received as the first and second output signals CO30 and CO31 from the control circuit 37. Thus, when the CAS latency CL1-CLn is less than the predetermined value, duty cycle operating current is blocked, thereby preventing duty cycle correction from being performed.

That is, when the CAS latency CL1-CLn is less than the predetermined value, the common mode control circuit 33 is disabled to prevent variation Δ in common mode from excessively increasing in contrast to the outcome described above with reference to FIG. 2, thereby preventing excess duty cycle correction. Accordingly, it is possible to prevent the output clock signal OCLK from becoming extremely distorted and dropping output clock signal OCLK pulses.

Figure 8:
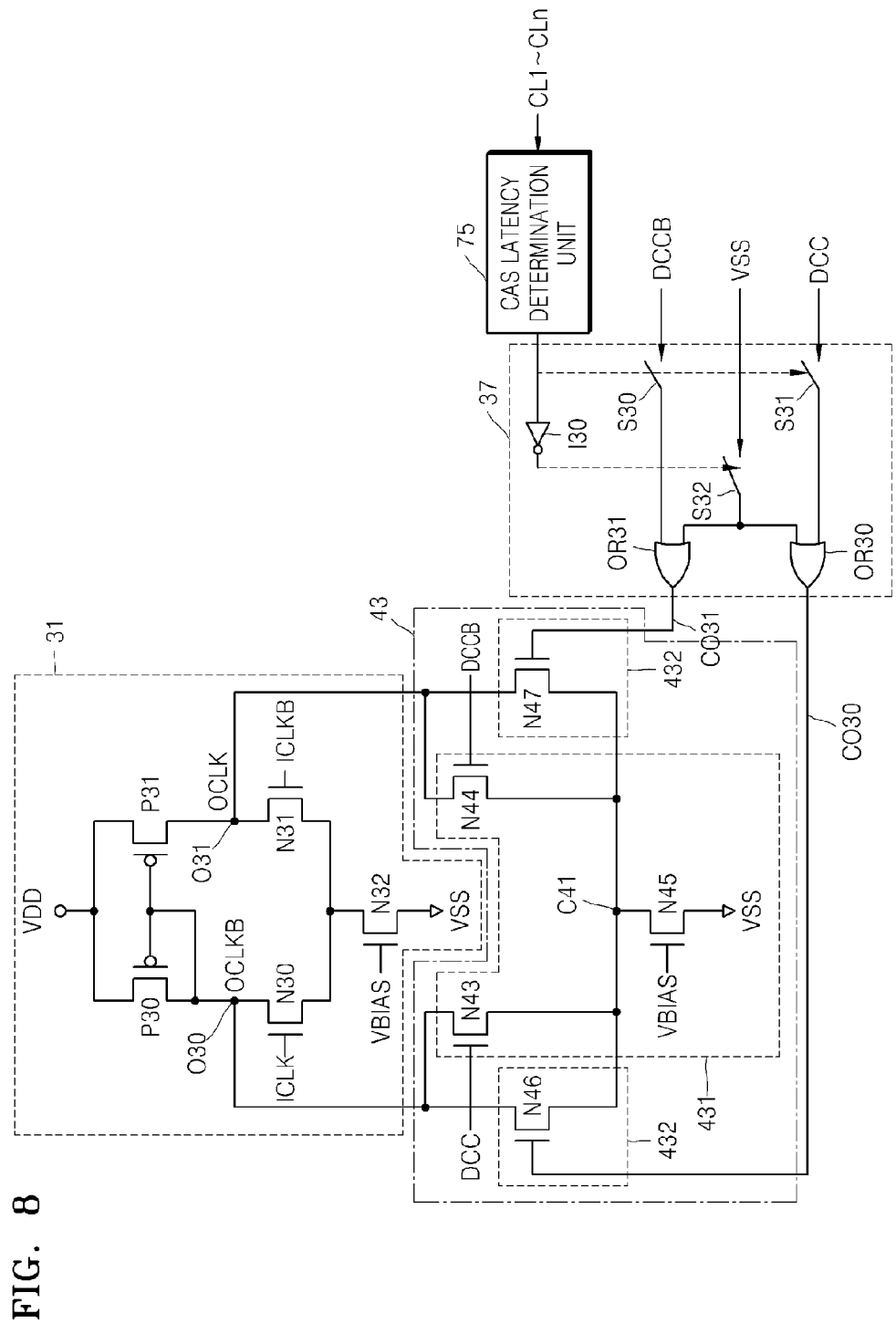
FIG. 8 is a circuit diagram of a duty cycle corrector according to another embodiment of the inventive concept.

FIG. 8 is a circuit diagram of a duty cycle corrector according to another embodiment of the inventive concept. Application of the duty cycle corrector of FIG. 8 is again illustrated in relation to an assumed synchronous semiconductor memory device, (e.g., a synchronous DRAM) provided a defined CAS latency.

Referring to FIG. 8, the duty cycle corrector comprises a duty cycle correction amplifier 31, a common mode control circuit 43, a CAS latency determination unit 75, and a control circuit 37.

The duty cycle correction amplifier 31, the CAS latency determination unit 75, and the control circuit 37 illustrated in FIG. 8 are substantially the same as the duty cycle correction amplifier 31, the CAS latency determination unit 75, and the control circuit 37 of FIG. 7. The common mode control circuit 43 of FIG. 8 is substantially the same as the common mode control circuit 43 of FIG. 4. Thus, a detailed description of the duty cycle correction amplifier 31, the CAS latency determination unit 75, the control circuit 37, and the common mode control circuit 43 will not be repeated here.

As described above, if the CAS latency determination unit 75 determines that a CAS latency CL1-CLn of the synchronous semiconductor memory device is greater than a predetermined value, the control circuit 37 respectively outputs a duty control signal DCC and a complementary duty control signal DCCB as first and second output signals CO30 and CO31. In this case, an auxiliary common mode control circuit 432 additionally changes the common mode of the duty cycle correction amplifier 31, in response to the duty control signal DCC and the complementary duty control signal DCCB received as the first and second output signals CO30 and CO31 from the control circuit 37.

However, if the CAS latency determination unit 75 determines that the CAS latency CL1-CLn is less than the predetermined value, the control circuit 37 outputs a ground voltage VSS as the first and second output signals CO30 and CO31. In this case, the auxiliary common mode control circuit 432 is disabled.

In other words, if the CAS latency CL1-CLn is greater than the predetermined value, both the main common mode control circuit 431 and the auxiliary common mode control circuit 432 changes the common mode of the duty cycle correction amplifier 31. However, if the CAS latency CL1-CLn is less than the predetermined value, the auxiliary common mode control circuit 432 is disabled, and thus, only the main common mode control circuit 431 changes the common mode of the duty cycle correction amplifier 31.

That is, when the CAS latency CL1-CLn is less than the predetermined value, the auxiliary common mode control circuit 432 is disabled to prevent variation Δ in common mode from excessively increasing, thereby preventing excessive duty cycle correction. As a result, it is possible to prevent an output clock signal OCLK from becoming excessively distorted and dropping output clock signal OCLK pulses.

Figure 9:
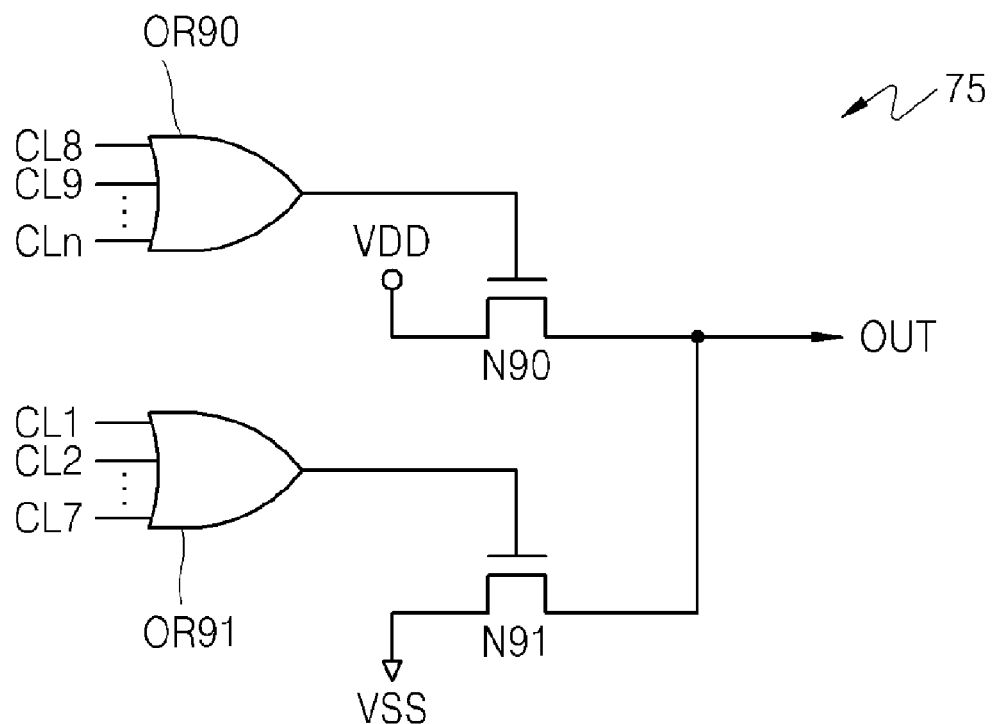
FIG. 9 is a circuit diagram further illustrating the column address strobe (CAS) latency determination unit of FIGS. 7 and 8 according to an embodiment of the inventive concept.

FIG. 9 is a circuit diagram of the CAS latency determination unit 75 illustrated in FIGS. 7 and 8 according to an embodiment of the inventive concept. Referring to FIG. 9, the CAS latency determination unit 75 comprises a first OR gate OR90, a second OR gate OR91, a first NMOS transfer transistor N90, and a second NMOS transfer transistor N91. The first OR gate OR90 receives high-CAS latency signals, e.g., CAS latency signals CL8-CLn. The second OR gate OR91 receives low-CAS latency signals, e.g., CAS latency signals CL1-CL7. The first NMOS transfer transistor N90 has one end connected to a source of power supply voltage VDD, the other end connected to an output terminal OUT, and a gate to which an output signal of the first OR gate OR90 is supplied. The second NMOS transfer transistor N91 has one end connected to a source of ground voltage VDD, the other end connected to the output terminal OUT, and a gate to which an output signal of the second OR gate OR91 is supplied.

Each of the CAS latency signals CL1-CL7, and CL8-CLn is activated high according to a CAS latency corresponding thereto. For example, when the CAS latency is equal to or greater than 8, one of the CAS latency signals CL8-CLn is activated high, and thus, the output signal of the first OR gate OR90 goes high. Then, the first NMOS transfer transistor N90 is turned ON, and a signal output from the output terminal OUT of the CAS latency determination unit 75 receives a voltage equal to the power supply voltage VDD (i.e., the output signal goes high). When the CAS latency is less than 8 (or is less than or equal to 7), one of the CAS latency signals CL1-CL7 is activated high, and thus, the output signal of the second OR gate OR91 goes high. Accordingly, the second NMOS transfer transistor N91 is turned ON, and the signal output from the output terminal OUT of the CAS latency determination unit 75 receives a voltage equal to the ground voltage VSS, (i.e., the output signal goes low).

Figure 10:
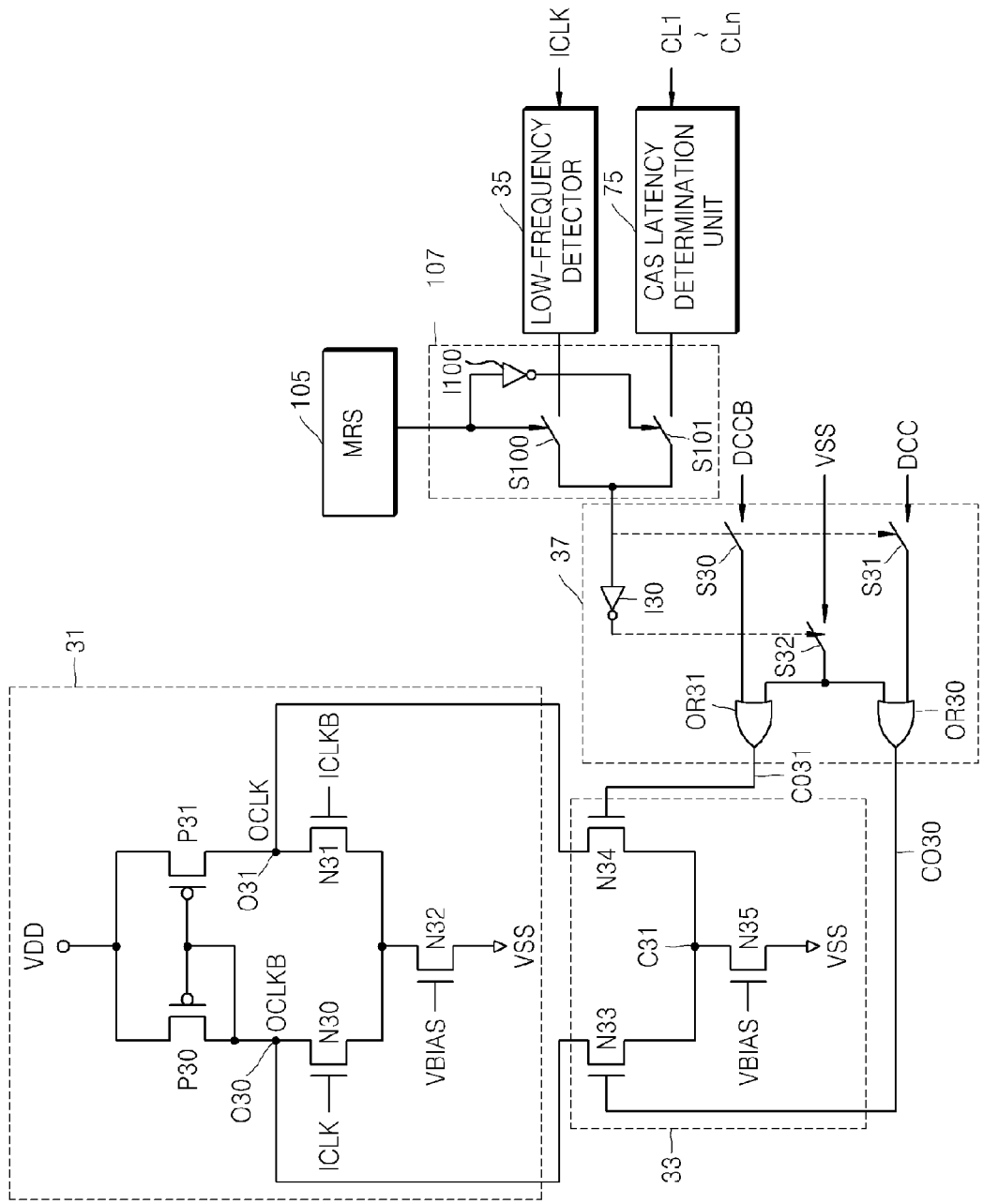
FIG. 10 is a circuit diagram of a duty cycle corrector according to another embodiment of the inventive concept.

FIG. 10 is a circuit diagram of a duty cycle corrector according to another embodiment of the inventive concept. Referring to FIG. 10, the duty cycle corrector comprises a duty cycle correction amplifier 31, a common mode control circuit 33, a control circuit 37, a low frequency detector 35, a CAS latency determination unit 75, a mode register set (MRS) 105, and a selector 107.

The duty cycle correction amplifier 31, the common mode control circuit 33, the control circuit 37, and the low frequency detector 35 illustrated in FIG. 10 are substantially the same as the duty cycle correction amplifier 31, the common mode control circuit 33, the control circuit 37, and the low frequency detector 35 illustrated in FIG. 3. The CAS latency determination unit 75 illustrated in FIG. 10 is substantially the same as the CAS latency determination unit 75 illustrated in FIG. 7. Thus, a detailed description of the duty cycle correction amplifier 31, the common mode control circuit 33, the control circuit 37, the low frequency detector 35, and the he CAS latency determination unit 75 will not be repeated here.

The MRS 105 is included in the semiconductor memory device, such as synchronous DRAM, and may be set by a user in order to control the internal operations of the semiconductor memory device. The selector 107 selects the low frequency detector 35 or the CAS latency determination unit 75, in response to an output signal of the MRS 105.

For example, when the MRS 105 is set to have a first logic value, the selector 107 selects an output signal of the low frequency detector 35 and supplies it to the control circuit 37. When the MRS 105 is set to have a second logic value, the selector 107 selects an output signal of the CAS latency determination unit 75 and supplies it to the control circuit 37. That is, a user may select the low frequency detector 35 or the CAS latency determination unit 75 by using the MRS 105.

If the low frequency detector 35 is selected, the duty cycle corrector of FIG. 10 operates similar to the duty cycle corrector of FIG. 3. If the CAS latency determination unit 75 is selected, the duty cycle corrector of FIG. 10 operates similar to the duty cycle corrector of FIG. 7. Thus, the operation of the duty cycle corrector of FIG. 10 will not be described here.

Figure 11:
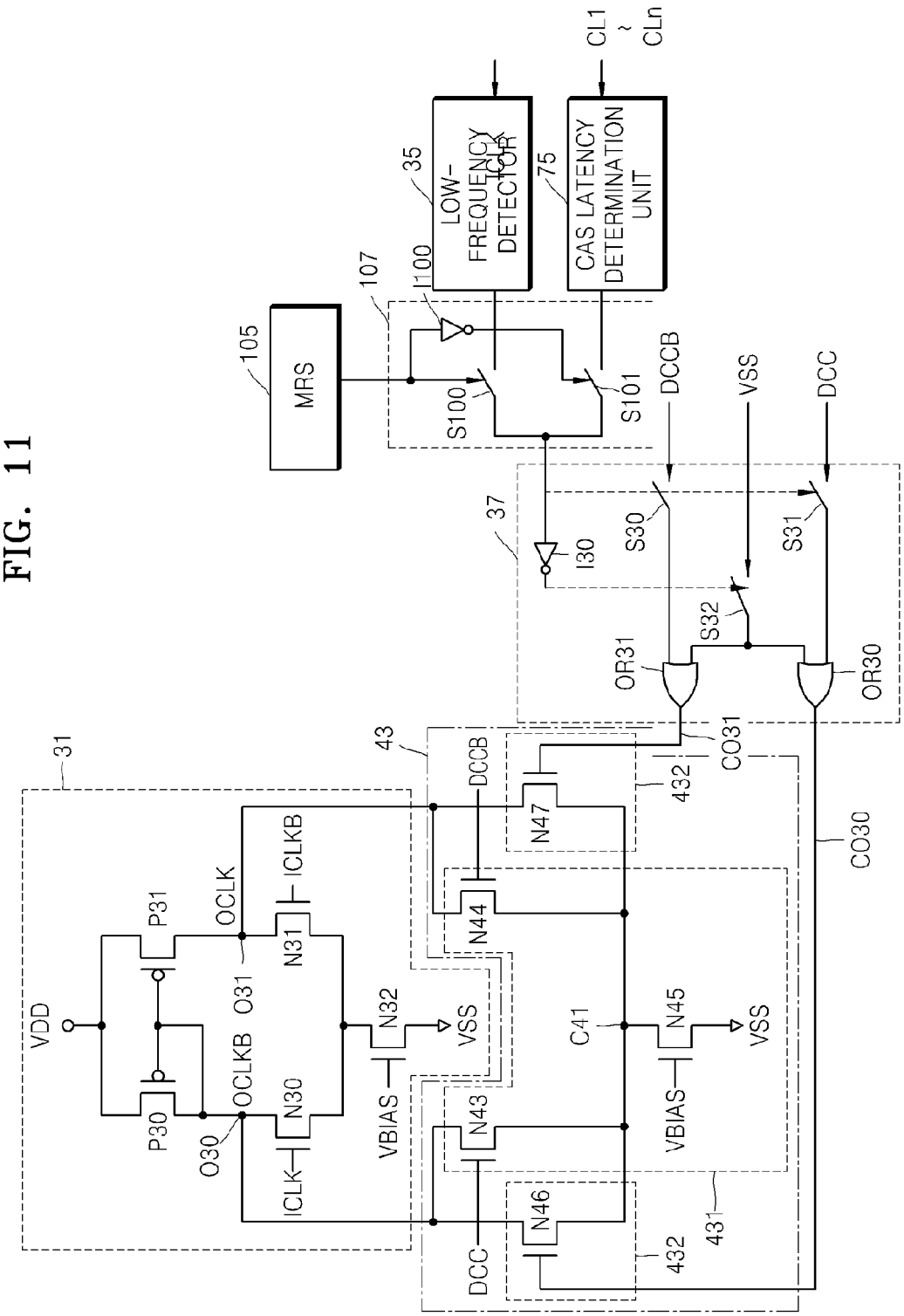
FIG. 11 is a circuit diagram of a duty cycle corrector according to another embodiment of the inventive concept.

FIG. 11 is a circuit diagram of a duty cycle corrector according to another embodiment of the inventive concept. Referring to FIG. 11, the duty cycle corrector includes a duty cycle correction amplifier 31, a common mode control circuit 43, a control circuit 37, a low frequency detector 35, a CAS latency determination unit 75, an MRS 105, and a selector 107.

The elements of FIG. 11 are the same as those of FIG. 10 except for the common mode control circuit 43. The common mode control circuit 43 of FIG. 11 is the same as the common mode control circuit 43 of FIG. 4. Thus, these elements of FIG. 11 will be not described here.

A user may select the low frequency detector 35 or the CAS latency determination unit 75 by using the MRS 15.

If the low frequency detector 35 is selected, the duty cycle corrector of FIG. 11 operates similar to the duty cycle corrector of FIG. 4. If the CAS latency determination unit 75 is selected, the duty cycle corrector of FIG. 11 operates similar to the duty cycle corrector of FIG. 8. Thus, a detailed description of the duty cycle corrector of FIG. 11 will not be provided here.

While the inventive concept has been particularly shown and described with reference to embodiments thereof, it will be understood that various changes in form and details may be made therein without departing from the scope of the following claims.

What is claimed is:

1. A duty cycle corrector comprising:
   a duty cycle correction amplifier configured to amplify an input clock signal and a complementary input clock signal;
   a low frequency detector configured to detect whether the input clock signal has a frequency greater than or less than a predetermined frequency;
   a control circuit configured to receive a duty control signal and a complementary duty control signal, output the duty control signal and the complementary duty control signal when the low frequency detector detects that the input clock signal frequency is greater than the predetermined frequency, and block the duty control signal and the complementary duty control signal when the low frequency detector detects that the input clock signal frequency is less than the predetermined frequency; and
   a common mode control circuit configured to adjust duty cycles of the input clock signal and the complementary input clock signal by changing a common mode of the duty cycle correction amplifier in response to the duty control signal and the complementary duty control signal.

2. The duty cycle corrector of claim 1, wherein upon detecting that input clock signal frequency is greater than the predetermined frequency, the common mode control circuit is further configured to adjust the duty cycles of the input clock signal and the complementary input clock signal by changing the common mode of the duty cycle correction amplifier in response to the duty control signal and the complementary duty control signal.

3. The duty cycle corrector of claim 1, wherein the common mode control circuit is further configured to be disabled when the low frequency detector detects that the input clock signal frequency is less than the predetermined frequency.

4. The duty cycle corrector of claim 1, wherein the common mode control circuit comprises:
   a main common mode control circuit configured to adjust the duty cycles of the input clock signal and the complementary input clock signal by changing the common mode of the duty cycle correction amplifier, wherein the duty control signal and the complementary duty control signal are directly supplied to the main common mode control circuit; and
   an auxiliary common mode control circuit configured to additionally change the common mode of the duty cycle correction amplifier in response to the duty control signal and the complementary duty control signal.

5. The duty cycle corrector of claim 4, wherein upon detecting that the input clock signal frequency is greater than the predetermined frequency, the auxiliary common mode control circuit is further configured to additionally change the common mode of the duty cycle correction amplifier in response to the duty control signal and the complementary duty control signal.

6. The duty cycle corrector of claim 4, wherein the auxiliary common mode control circuit is further configured to be disabled when the low frequency detector detects that the input clock signal frequency is less than the predetermined frequency.

7. A duty cycle corrector adapted for use within a semiconductor memory device providing a defined column address strobe (CAS) latency, the duty cycle corrector comprising:
   a duty cycle correction amplifier configured to amplify an input clock signal and a complementary input clock signal;
   a CAS latency determination unit configured to determine whether the CAS latency is greater than or less than a predetermined value;
   a control circuit configured to receive a duty control signal and a complementary duty control signal, output the duty control signal and the complementary duty control signal when the CAS latency determination unit determines that the CAS latency is greater than the predetermined value, and block the duty control signal and the complementary duty control signal when the CAS latency determination unit determines that the CAS latency is less than the predetermined value; and
   a common mode control circuit configured to adjust duty cycles of the input clock signal and the complementary input clock signal by changing a common mode of the duty cycle correction amplifier in response to the duty control signal and the complementary duty control signal.

8. The duty cycle corrector of claim 7, wherein upon determining that the if the CAS latency is greater than the predetermined value, the common mode control circuit is further configured to adjust the duty cycles of the input clock signal and the complementary input clock signal by changing the common mode of the duty cycle correction amplifier in response to the duty control signal and the complementary duty control signal.

9. The duty cycle corrector of claim 7, wherein the common mode control circuit is further configured to be disabled when the CAS latency determination unit determines that the CAS latency is less than the predetermined frequency.

10. The duty cycle corrector of claim 7, wherein the common mode control circuit comprises:
    a main common mode control circuit configured to adjust the duty cycles of the input clock signal and the complementary input clock signal by changing the common mode of the duty cycle correction amplifier, wherein the duty control signal and the complementary duty control signal are directly supplied to the main common mode control circuit; and an auxiliary common mode control circuit configured to additionally change the common mode of the duty cycle correction amplifier in response to the duty control signal and the complementary duty control signal.

11. The duty cycle corrector of claim 10, wherein upon determining that the CAS latency is greater than the predetermined value, the auxiliary common mode control circuit is further configured to additionally change the common mode of the duty cycle correction amplifier in response to the duty control signal and the complementary duty control signal.

12. The duty cycle corrector of claim 10, wherein the auxiliary common mode control circuit is further configured to be disabled when the CAS latency determination unit determines that the CAS latency is less than the predetermined frequency.

* * * * *